(12) United States Patent
Shimizu

(10) Patent No.: US 6,844,613 B2
(45) Date of Patent: Jan. 18, 2005

(54) SEMICONDUCTOR DEVICE

(75) Inventor: Kazuhiro Shimizu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/430,291

(22) Filed: May 7, 2003

(65) Prior Publication Data

US 2004/0104455 A1 Jun. 3, 2004

(30) Foreign Application Priority Data

Nov. 28, 2002 (JP) ........................................ 2002-345724

(51) Int. Cl.[7] ............................................. H01L 23/58
(52) U.S. Cl. ..................................... 257/659; 257/508
(58) Field of Search .................................... 257/508, 659

(56) References Cited

U.S. PATENT DOCUMENTS

| 4,292,642 A |   | 9/1981  | Appels et al. |           |
|-------------|---|---------|---------------|-----------|
| 4,926,243 A | * | 5/1990  | Nakagawa et al. | 257/659 |
| 5,455,439 A |   | 10/1995 | Terashima et al. |       |
| 5,585,664 A | * | 12/1996 | Ito           | 257/659   |
| 5,731,628 A |   | 3/1998  | Terashima     |           |
| 5,907,182 A |   | 5/1999  | Terashima     |           |
| 6,307,252 B1| * | 10/2001 | Knoedl, Jr.   | 257/659   |
| 6,344,888 B2| * | 2/2002  | Yasukawa      | 349/113   |
| 6,348,722 B1| * | 2/2002  | Yoshikoshi    | 257/508   |

FOREIGN PATENT DOCUMENTS

| JP | 5-47787   | 2/1993  |
| JP | 8-274167  | 10/1996 |
| JP | 10-12607  | 1/1998  |
| JP | 11-204733 | 7/1999  |

* cited by examiner

*Primary Examiner*—Jerome Jackson
(74) *Attorney, Agent, or Firm*—Oblon, Spivak, McClelland, Maier & Neustadt, P.C.

(57) ABSTRACT

A floating electrode (201) and an electrode (202) are coupled together by an electrostatic capacitance (C1), the floating electrode (201) and an electrode (203) are coupled together by an electrostatic capacitance (C2), and an electrode (200) and the floating electrode (201) are coupled together by an electrostatic capacitance (C3). The potential of the floating electrode (201) is lower than the potential applied to the electrode (200). The floating electrode (201) covers above the electrode (200). For example, as viewed in section, the elevation angles ($\alpha$, $\beta$) of widthwise edges of the electrode (201) from the near widthwise edges of the electrode (200) should preferably be not more than 45 degrees.

15 Claims, 17 Drawing Sheets

SEMICONDUCTOR DEVICE

BACKGROUND OF THE INVENTION

1. Field of the Invention

The present invention relates to a technique for shielding an electric field.

2. Description of the Background Art

In a semiconductor device having a semiconductor chip covered with a solid or gel resin, ions as impurities in the resin move by the applied voltage, exhibiting polarization. In this case, a voltage produced by the ions exceeds the threshold voltage of elements forming an integrated circuit and a channel for carrying leakage current is formed between adjacent elements, which prevents the elements from carrying out their functions. Such a problem is pointed out in, for example, Japanese Patent Application Laid-open No. 11-204733.

Further, a technique for reducing electromagnetic noise which is emitted from an interconnect layer and gets into another circuit portion is disclosed in, for example, Japanese Patent Application Laid-open Nos. 5-47767 and 8-274167.

However, if the interconnect layer is enclosed by a conductive material which is continuous as viewed in section and which is supplied with a fixed potential, a voltage applied to an insulating material provided between the interconnect layer and the conductive material increases with increasing applied voltage to the interconnect layer, which results in a tendency to easily cause dielectric breakdown in the insulating material.

SUMMARY OF THE INVENTION

An object of the present invention is to provide a technique for shielding an electric field from an interconnect layer and reducing the occurrence of dielectric breakdown.

According to the present invention, a semiconductor device includes a semiconductor substrate, an insulating layer, and first through third electrodes. The insulating layer is formed on the semiconductor substrate. The first electrode extends on the insulating layer and is applied with a first potential. The second electrode is isolated from the surroundings. The third electrode is applied with a second potential lower than the first potential and provides capacitive coupling with the second electrode. There exists a cross section which is perpendicular to a direction of extension of the first electrode and in which the second electrode is located on the side of the first electrode opposite the semiconductor substrate.

The strength of an electric field from the second electrode can be lower than that from the first electrode, and a voltage applied between the first and second electrodes can be reduced than when the first electrode is enclosed by a conductive material which is continuous as viewed in section and which is applied with a low potential. This reduces the occurrence of dielectric breakdown in the insulating layer between the first and second electrodes. Electrostatic capacitances between the first and second electrodes and between the first and third electrodes are allowed to be controlled and thereby a shielding effect and a breakdown voltage are properly set.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
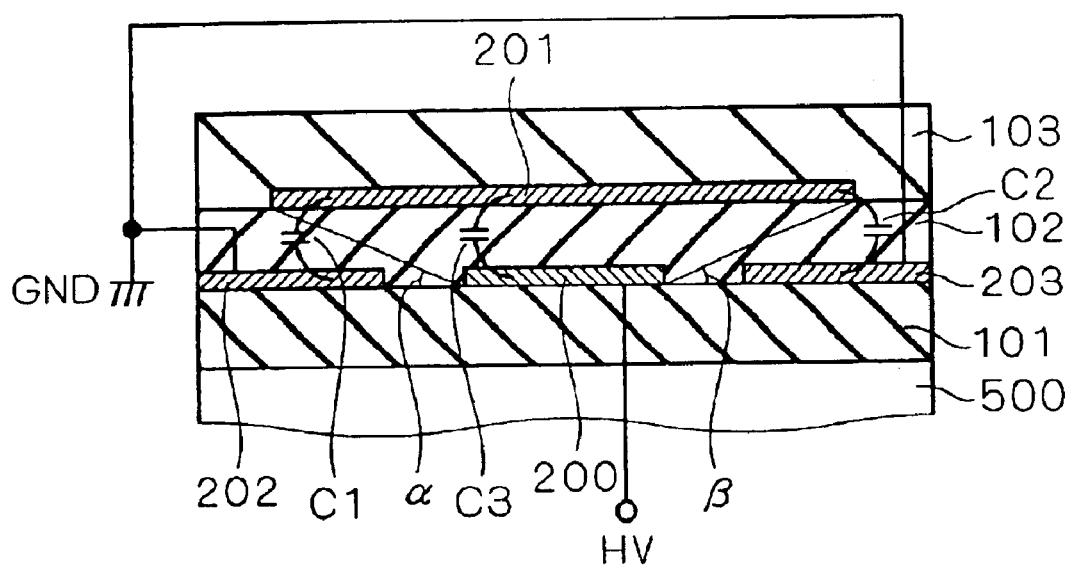
FIG. 1 is a cross-sectional view of a semiconductor device according to a first preferred embodiment of the present invention.

FIG. 1 is a cross-sectional view of a semiconductor device according to a first preferred embodiment of the present invention. Insulating layers 101, 102 and 103 are deposited on a semiconductor substrate 500 in this order. In the following description, a direction toward the insulating layers 101, 102 and 103 as viewed from the semiconductor substrate 500 is referred to as an upward direction and a direction opposite to that direction as a downward direction. For example, the insulating layer 103 lies "above" the semiconductor substrate 500, or the semiconductor substrate 500 lies "under" the insulating layer 103. Electrodes 200, 202 and 203 are formed in a same layer in the vicinity of the boundary between the insulating layers 101 and 102, and an electrode 201 is formed in the vicinity of the boundary between the insulating layers 102 and 103. Such a structure can be obtained by, for example, successively forming the insulating layer 101, the electrodes 200, 202 and 203, the insulating layer 102, the electrode 201 and the insulating layer 103 on the semiconductor substrate 500. The electrodes 200, 201 and 202 are isolated from each other, whereas the electrodes 202 and 203 are connected to each other.

The electrode 200 extends along a direction perpendicular to the plane of the drawing and is applied with a high potential HV. The electrodes 202 and 203, on the other hand, are applied with a low potential GND. For example, the high potential HV is 30 volts or more and the low potential GND is a ground potential. The electrode 201 is isolated from the surroundings and its potential is determined by its capacitive coupling with the surroundings. In the present invention, such an electrode which is isolated from the surroundings and whose potential is determined by its capacitive coupling is provisionally referred to as a "floating electrode."

In a cross section which is perpendicular to the direction of extension of the electrode 200 applied with the high potential HV (hereinafter referred to as a "high-potential interconnect cross section"), the floating electrode 201 covers above the electrode 200. As described below, the floating electrode 201 does not necessarily cover above the electrode 200 in the high-potential interconnect cross section at every position of the extending electrode 200. In other words, a high-potential interconnect cross section in which the floating electrode 201 is located on the side of the electrode 200 opposite the semiconductor substrate 500, exists at some position of the extending electrode 200. Of course, in the high-potential interconnect cross section at every position of the extending electrode 200, the floating electrode 201 may be located on the side of the electrode 200 opposite the semiconductor substrate 500.

Where the floating electrode 201 and the electrode 202 are coupled together by an electrostatic capacitance C1, the floating electrode 201 and the electrode 203 are coupled together by an electrostatic capacitance C2, the electrode 200 and the floating electrode 201 are coupled together by an electrostatic capacitance C3, and a charge QF is accumulated at the floating electrode 201 and produces a potential VF, the following equation (1) is true:

$$(C1+C2)(VF-0)+C3(VF-HV)+QF=0 \quad (1)$$

However, since there is no supply source of charge to the floating electrode 201 and accordingly the value of the charge QF is zero, the potential VF can be obtained from the following equation (2) and the inequality VF<HV holds.

$$VF=C3 \cdot HV/(C1+C2+C3) \quad (2)$$

Accordingly, the strength of an electric field from the floating electrode 201 which covers the electrode 200 to peripheral low-potential regions can be lower than that from the electrode 200 to peripheral low-potential regions. That is, the electric field from the electrode 200 can be shielded.

Besides, a voltage applied to the insulating layer 102 between the electrode 200 and the floating electrode 201 is (HV−VF)/HV, which is lower than when the electrode 200 is enclosed by a conductive material which is continuous as viewed in section and which is applied with the potential GND. This can reduce the occurrence of dielectric breakdown in the insulating layer 102.

For effective shielding, the electrostatic capacitances C1 and C2 should preferably be larger than the electrostatic capacitance C3 to reduce the potential VF; however, in terms of a reduction in the occurrence of dielectric breakdown in the insulating layer 102, the electrostatic capacitances C1 and C2 should preferably be smaller than the electrostatic capacitance C3. In other words, by employing the floating electrode 201 and the electrodes 202 and 203 isolated from the floating electrode 201, it is possible to control the parameters such as the electrostatic capacitances C1, C2 and C3 and thereby to properly set the shielding effect and the breakdown voltage.

Of course, the electrode 203 is not an absolute necessity in this preferred embodiment and thus can be omitted. In that case, the electrostatic capacitance C2 in the above description is treated as zero.

The floating electrode 201 should preferably cover above the electrode 200 applied with the high potential HV. Further, in terms of shielding of an electric field, the angles of elevation α and β of widthwise edges of the floating electrode 201 from the near widthwise edges of the electrode 200 as viewed in section should preferably be not more than 45 degrees.

The aforementioned effect of shielding the electrode applied with the high potential HV is especially desired when in the periphery of the electrode are semiconductor elements driven at lower potentials than the high potential HV.

Figure 2:
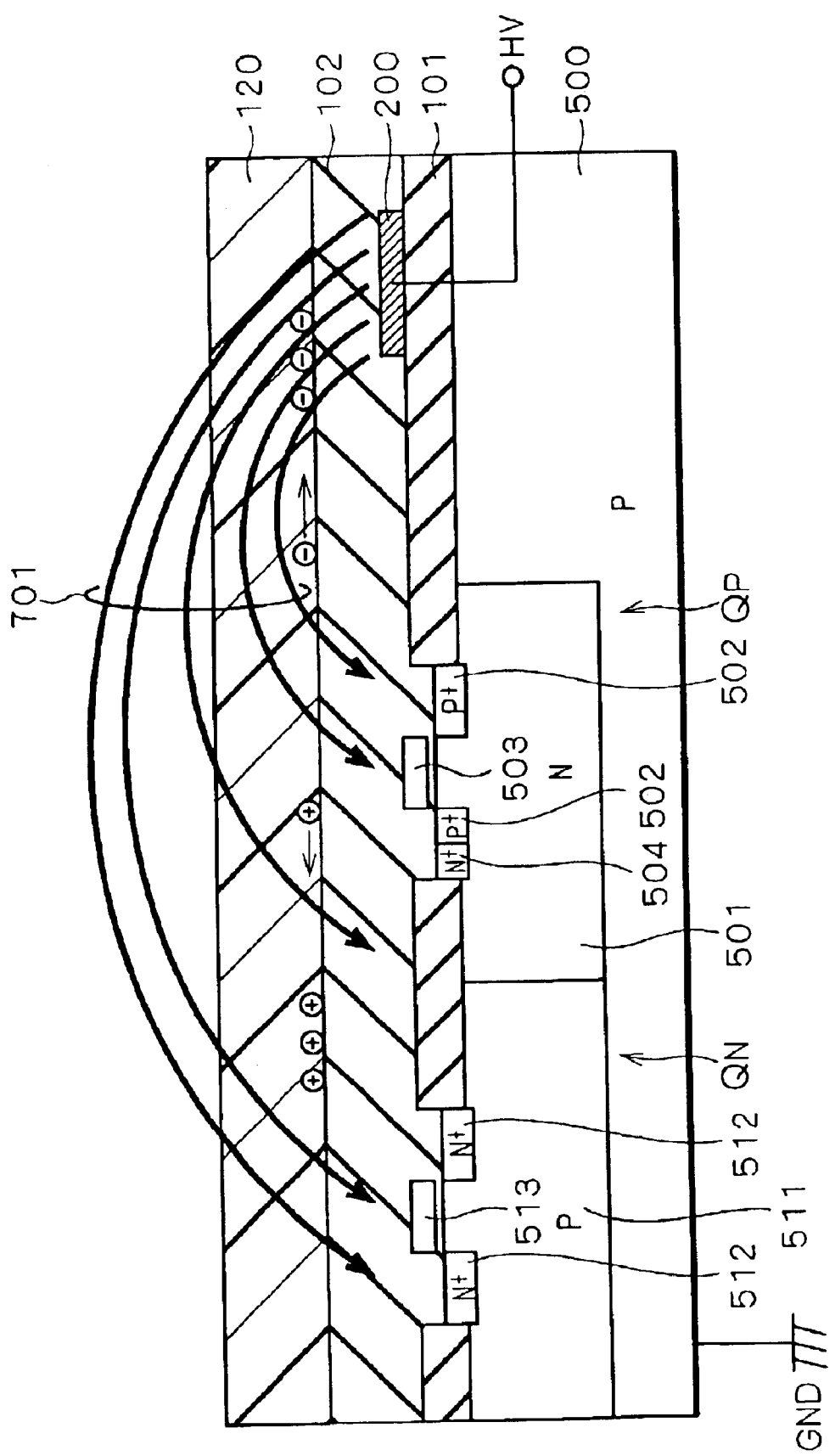
FIGS. 2 through 4 are cross-sectional views for explaining the effect of the first preferred embodiment of the present invention.
Figure 3:
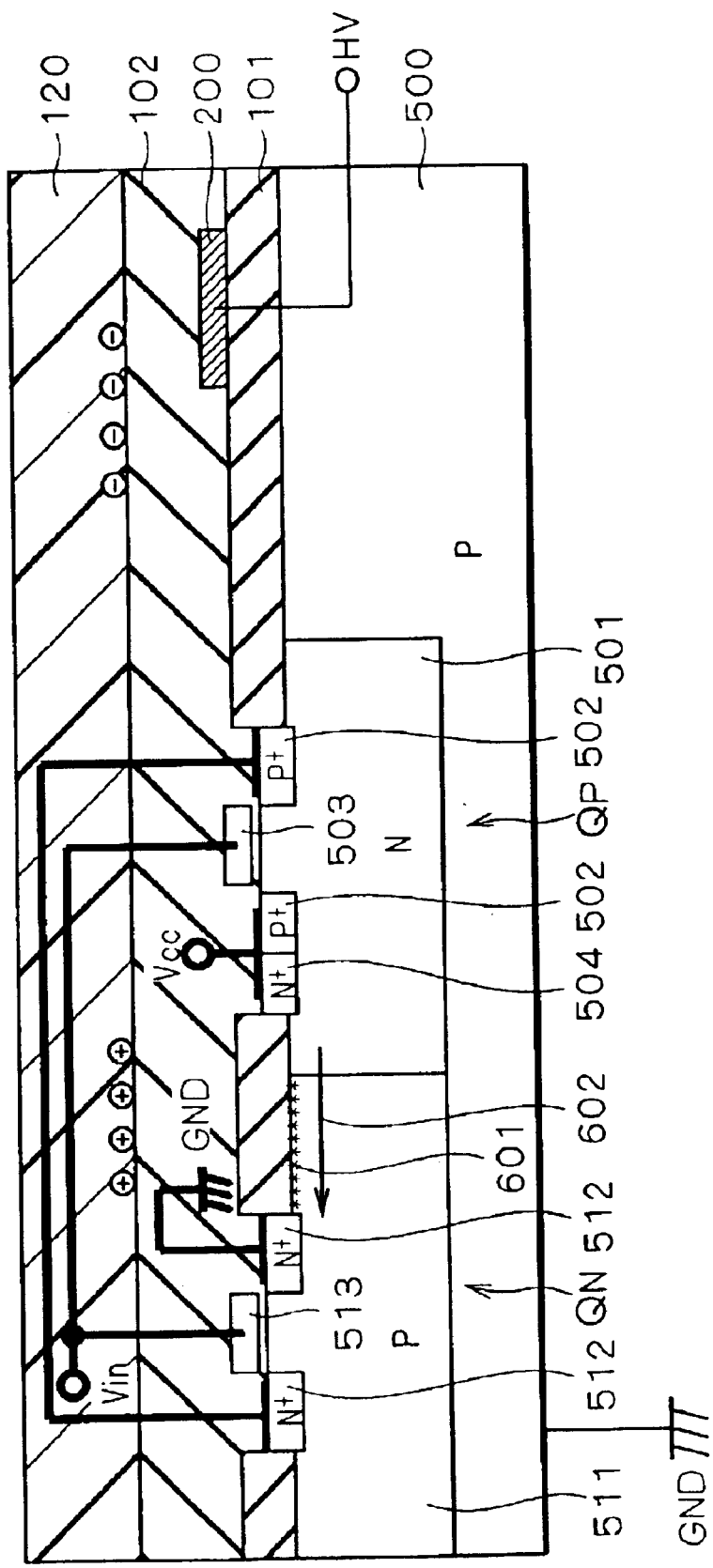
Figure 4:
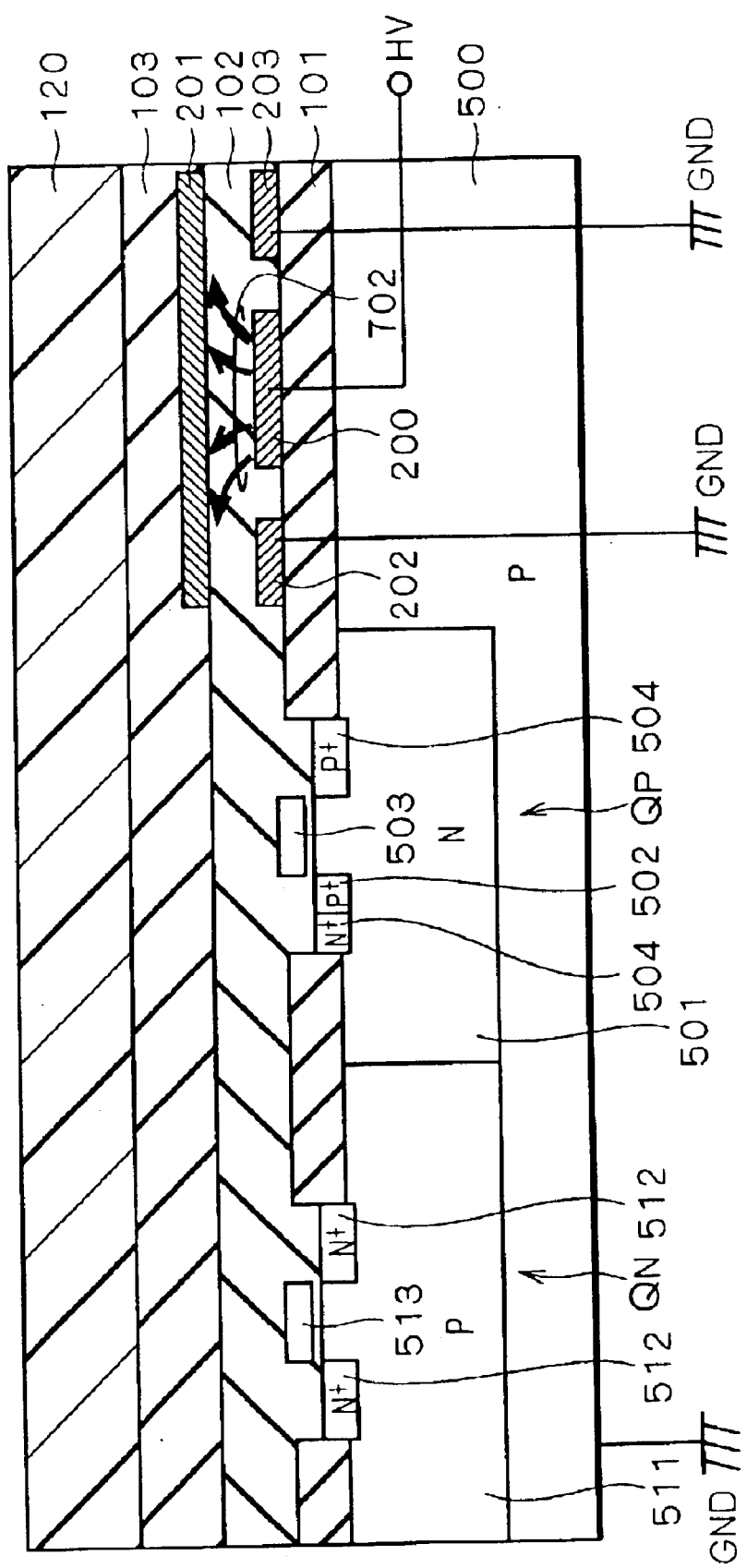

FIGS. 2 through 4 are cross-sectional views for explaining the effect of this preferred embodiment. FIGS. 2 and 3 illustrate the case without application of this preferred embodiment, and FIG. 4 illustrates the case with application of this preferred embodiment.

Referring to FIG. 2, in the semiconductor substrate 500, an N well 501 and a P well 511 are formed in which an NMOS transistor QP and a PMOS transistor QN respectively are formed. The PMOS transistor QN and the NMOS transistor QP form a CMOS transistor.

More specifically, a pair of $P^+$ layers 502 are spaced from each other on the N well 501 and a gate 503 is formed between and above the $P^+$ layers 502. An $N^+$ layer 504 is formed adjoining one of the $P^+$ layers 502, these layers 504 and 502 serving respectively as the backgate and the source. The other of the $P^+$ layers 502 serves as the drain. A pair of $N^+$ layers 512 are spaced from each other on the P well 511 and a gate 513 is formed between and above the $N^+$ layers 512. The $N^+$ layers 512 serve as the source and the drain. The transistors QN and QP are separated by the insulating layer 101 and covered with the insulating layer 102 and a mold resin 120 in this order. For simplicity of drawing, gate oxide films under the gates 503 and 513 are included in and shown as the insulating layer 102.

In a direction of extension of the insulating layer 101 away from the transistors QN and QP, the electrode 200 is formed on the insulating layer 101 and covered with the insulating layer 102 and the mold resin 120 in this order. A potential Vcc applied to the transistors QN and QP is, for example, approximately 5 volts, and the electrode 200 applied with the potential HV higher than the potential Vcc is usually located as interconnection in the uppermost layer. This is because it is difficult for an interlayer insulation film to isolate the interconnection applied with a high potential and because, in many cases, current flowing through such interconnection is at a level between several tens and several hundreds mA and thus a thick interconnect line of 1 μm or more is employed.

At high glass transition temperatures of, for example, about 150° C., some constituents of the mold resin 120 such as boron are ionized. Thus, after a molding process utilizing the heated mold resin 120, an electric field 701 from the electrode 200 to peripheral low-potential regions causes polarization of the mold resin 120. In FIG. 2, the encircled plus and minus signs indicate positive and negative charges, respectively. Since the potential in the vicinity of the transistors QN and QP is lower than the potential of the electrode 200, negative charges are accumulated in the vicinity of the electrode 200 and positive charges are accumulated in the vicinities of the transistors QN and QP.

FIG. 3 shows the case where, under the aforementioned polarization of the mold resin 120, proper potentials are applied respectively to the sources and drains of the transistors QN and QP. Illustrated herein is the case where the transistors QN and QP constitute an inverter, in which case an input potential Vin is applied in common to the gates 503 and 513 and the P$^+$ layer 502 and the N$^+$ layer 512 both serving as the drains are connected to each other. Further, the potential Vcc is applied to the P$^+$ layer 502 serving as the source and the N$^+$ layer 504 serving as the backgate, and the potential GND is applied to the N$^+$ layer 512 serving as the source.

The accumulation of much positive charges due to polarization results in the formation of a region 601 with a changed band structure in the upper portion of the P well 511 in the vicinity of the N well 501. Then, a leakage current flows in a direction indicated by an arrow 602 from the N$^+$ layer 504 to the N$^+$ layer 601. To solve such a problem, it is possible to space the electrode 200 apart from the transistors QN and QP to such an extent that the electric field exerts no effect on the transistors QN and QP, in which case, however, circuit density is reduced. It is also possible to form the mold resin 120 of a material having good resistance to polarization or to shield polarized ions by a semi-insulation glass coated film. However, in either case, there are problems of cost increase and the necessity of introducing new manufacturing equipment. From this, it is desirable to use a conductive material for shielding the electric field from the electrode 200.

FIG. 4 shows a structure in which the floating electrode 201 and the electrodes 202 and 203, all shown in FIG. 1, are located around the electrode 200 shown in FIG. 2 or 3. For the formation of the floating electrode 201, the insulating layer 103 is interposed between the insulating layer 102 and the mold resin 120. The electrode 200 is shielded in the same way as described with reference to FIG. 1. For example, an electric field 702 from the electrode 200 can effectively be shielded by the floating electrode 201.

Like the semiconductor device illustrated in the first preferred embodiment, semiconductor devices to be illustrated in subsequent second through sixth preferred embodiments can also prevent polarization of a mold resin by the application of the present invention to the case where in the periphery of the electrode applied with the high potential HV are semiconductor elements driven at lower potentials than the high potential HV.

Second Preferred Embodiment

Figure 5:
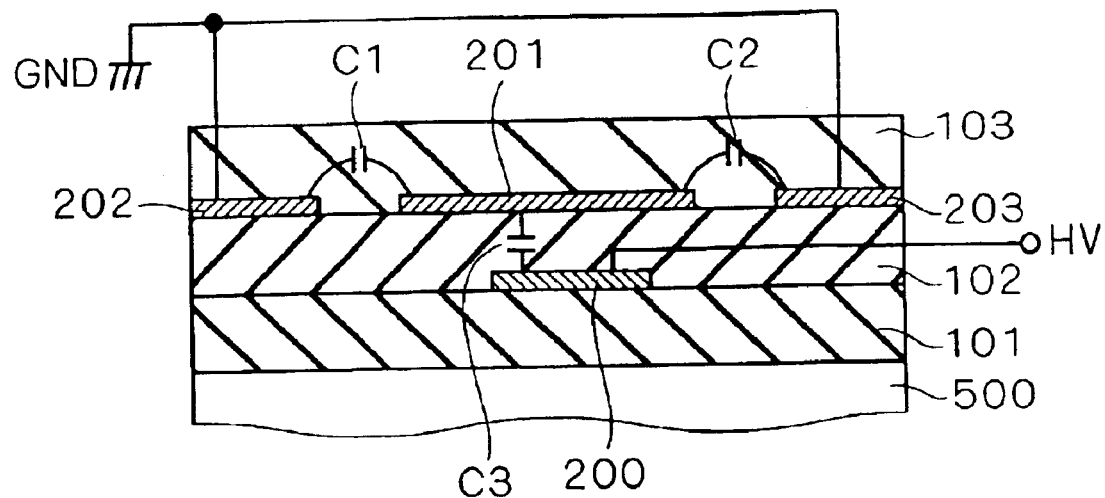
FIG. 5 is a cross-sectional view of a semiconductor device according to a second preferred embodiment of the present invention.

FIG. 5 is a cross-sectional view of a semiconductor device according to a second preferred embodiment of the present invention. The insulating layers 101, 102 and 103 are deposited on the substrate 500 in this order. The electrode 200 applied with the high potential HV is formed in the vicinity of the boundary between the insulating layers 101 and 102, and the floating electrode 201 and the electrodes 202 and 203 applied with the low potential GND are formed in a same layer in the vicinity of the boundary between the insulating layers 102 and 103. Such a structure can be obtained by, for example, successively forming the insulating layer 101, the electrode 200, the insulating layer 102, the floating electrode 201 and the electrodes 202 and 203, and the insulating layer 103 on the semiconductor substrate 500.

The electrode 200 extends along a direction perpendicular to the plane of the drawing and the floating electrode 201 covers above the electrode 200 in the high-potential interconnect cross section. A high-potential interconnect cross section in which the floating electrode 201 is located on the side of the electrode 200 opposite the semiconductor substrate 500, exists at some position of the extending electrode 200. Of course, in the high-potential interconnect cross section at every position of the extending electrode 200, the floating electrode 201 may be located on the side of the electrode 200 opposite the semiconductor substrate 500.

Also in this preferred embodiment, the electrostatic capacitance C1 is provided between the floating electrode 201 and the electrode 202, the electrostatic capacitance C2 is provided between the floating electrode 201 and the electrode 203, and the electrostatic capacitance C3 is provided between the electrode 200 and the floating electrode 201, from which Equation (2) is true. Thus, the same effect as described in the first preferred embodiment can be achieved.

Figure 6:
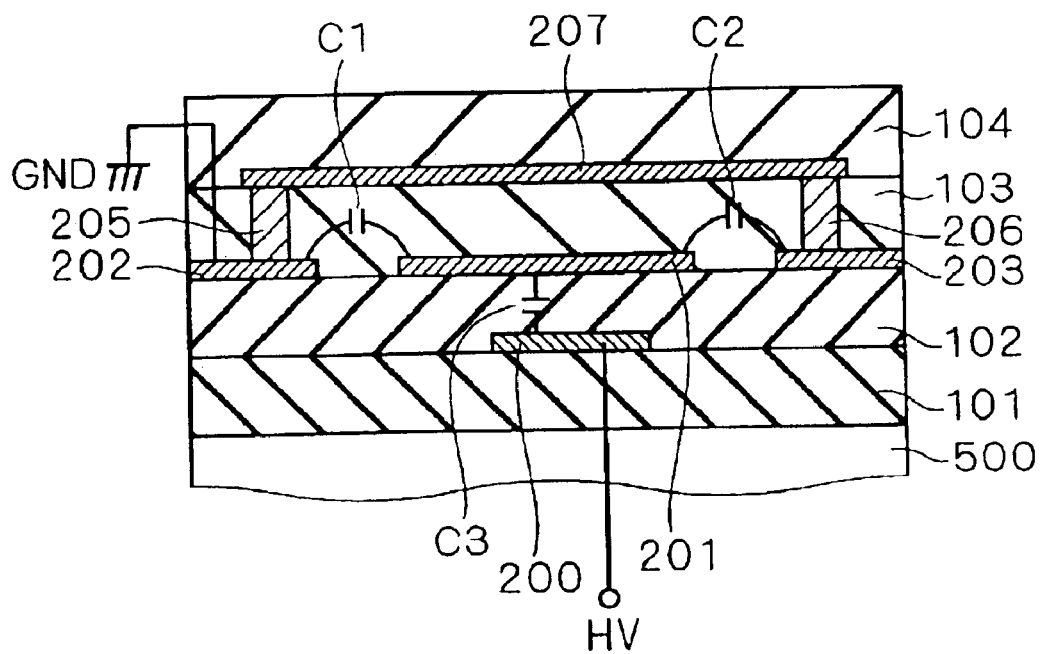
FIG. 6 is a cross-sectional view showing a modification of the second preferred embodiment of the present invention.

FIG. 6 is a cross-sectional view showing a modification of this preferred embodiment. An insulating layer 104 is further formed on the insulating layer 103 and an electrode 207 is formed in the boundary between the insulating layers 103 and 104. The electrode 207 is located on the side of the electrode 201 opposite the electrode 200. Such a structure can be obtained by, for example, successively forming the insulating layer 103, the electrode 207 and the insulating layer 104.

The electrodes 207 and 202 are connected to each other through a conductive plug 205, and the electrodes 207 and 203 are connected to each other through a conductive plug 206. The conductive plugs 205 and 206 extend through the insulating layer 103 in the direction of thickness of the insulating layer 103. That is, the electrodes 202 and 203 can be connected to each other through the electrode 207.

Of course, also in this preferred embodiment and in the modification thereof, the electrode 203 is not an absolute necessity and thus can be omitted. Further, the elevation angles of the widthwise edges of the floating electrode 201 from the near widthwise edges of the electrode 200 should preferably be not more than 45 degrees.

Third Preferred Embodiment

Figure 7:
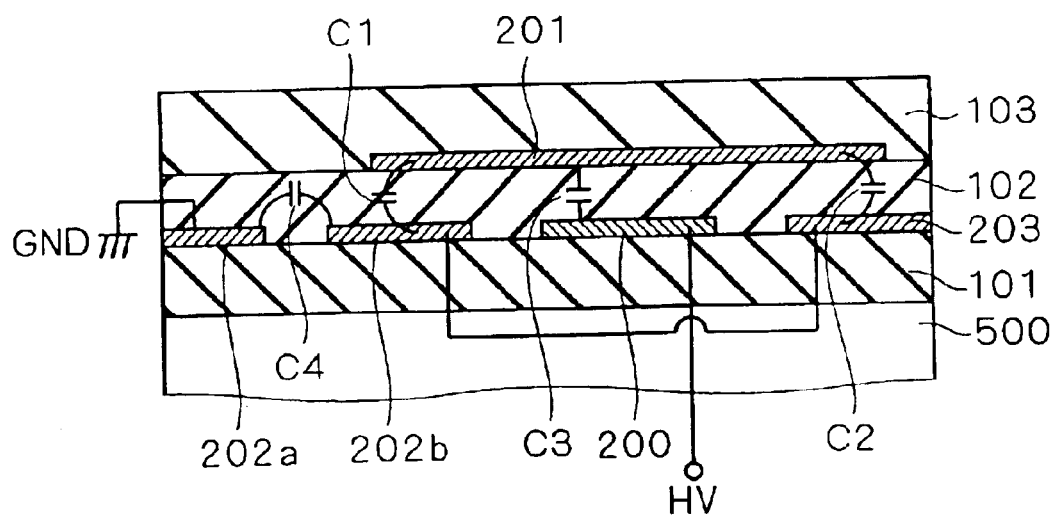
FIG. 7 is a cross-sectional view of a semiconductor device according to a third preferred embodiment of the present invention.

FIG. 7 is a cross-sectional view of a semiconductor device according to a third preferred embodiment of the present invention. The insulating layers 101, 102 and 103 are deposited on the substrate 500 in this order. The electrode 200 applied with the high potential HV, floating electrodes 202b and 203, and an electrode 202a applied with the low potential GND are formed in the vicinity of the boundary between the insulating layers 101 and 102, and the floating electrode 201 is formed in the vicinity of the boundary between the insulating layers 102 and 103. The electrodes 202b and 203 are connected to each other and located in the same layer as the electrode 200. Such a structure can be obtained by, for example, successively forming the insulating layer 101, the electrodes 200 and 202a and the floating electrodes 202b and 203, the insulating layer 102, the floating electrode 201, and the insulating layer 103 on the semiconductor substrate 500.

The electrode 200 extends along a direction perpendicular to the plane of the drawing and the floating electrode 201 covers above the electrode 200 in the high-potential interconnect cross section. A high-potential interconnect cross section in which the floating electrode 201 is located on the side of the electrode 200 opposite the semiconductor substrate 500, exists at some position of the extending electrode 200. Of course, in the high-potential interconnect cross section every position of the extending electrode 200, the floating electrode 201 may be located on the side of the electrode 200 opposite the semiconductor substrate 500.

In this preferred embodiment, the floating electrodes 201 and 202b are coupled together by the electrostatic capacitance C1, the floating electrodes 201 and 203 are coupled together by the electrostatic capacitance C2, the electrode 200 and the floating electrode 201 are coupled together by the electrostatic capacitance C3, and the electrode 202a and the floating electrode 202b are coupled together by an electrostatic capacitance C4. In other words, the structure illustrated in FIG. 7 is such that the electrode 202 shown in FIG. 1 is divided into the electrode 202a and the floating electrode 202b and the low potential GND is applied to the electrode 202a. Thus, as compared with the case of the first preferred embodiment, there is a potential difference applied to the electrostatic capacitance C4, which reduces a potential difference across the electrostatic capacitances C1 to C3 and increases dielectric strength.

Figure 8:
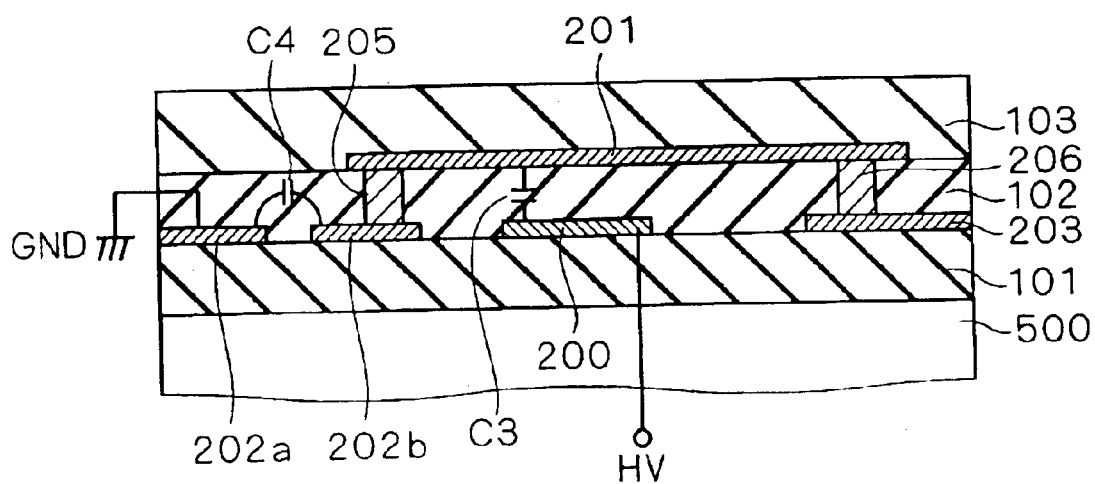
FIG. 8 is a cross-sectional view showing a modification of the third preferred embodiment of the present invention.

FIG. 8 is a cross-sectional view showing a modification of this preferred embodiment. The floating electrodes 201 and 202b are connected to each other through the conductive plug 205, and the floating electrodes 201 and 203 are connected to each other through the conductive plug 206. The conductive plugs 205 and 206 extend through the insulating layer 102 in the direction of thickness of the insulating layer 102.

In this modification, the electrostatic capacitances C1 and C2 in the structure shown in FIG. 7 are treated as zero. The potential difference (HV−GND) is proportionally divided by the electrostatic capacitances C3 and C4 which are connected in series. This can further increase dielectric strength than when the electrode 200 is enclosed by a continuous conductive material as viewed in section.

Of course, also in this preferred embodiment, the electrode 203 is not an absolute necessity and thus can be omitted. Further, the elevation angles of the widthwise edges of the floating electrode 201 from the near widthwise edges of the electrode 200 should preferably be not more than 45 degrees.

Fourth Preferred Embodiment

Figure 9:
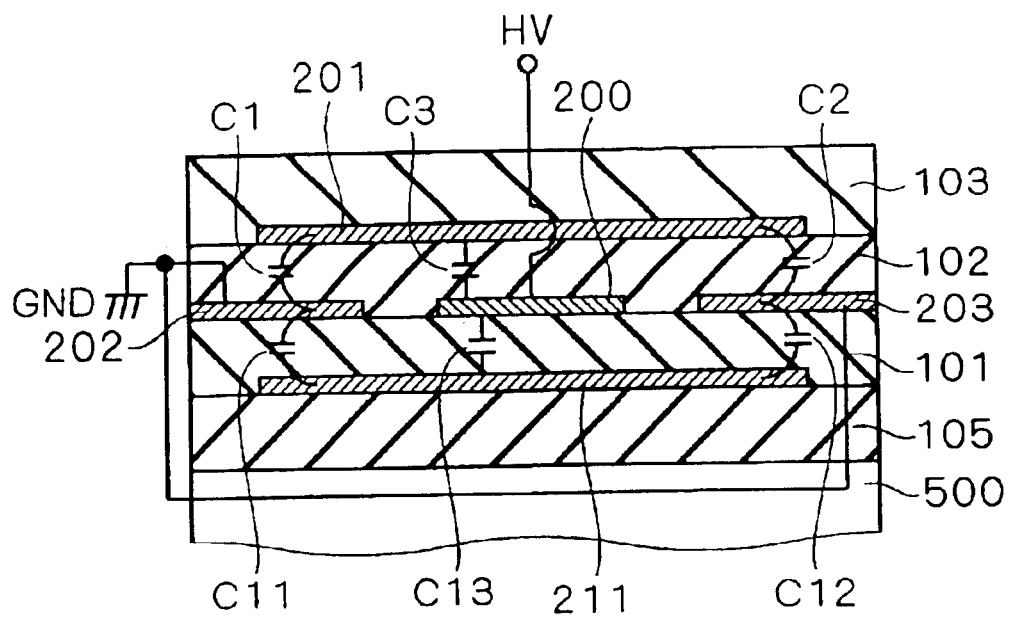
FIG. 9 is a cross-sectional view of a semiconductor device according to a fourth preferred embodiment of the present invention.

FIG. 9 is a cross-sectional view of a semiconductor device according to a fourth preferred embodiment of the present invention. As for the part above the boundary between the insulating layers 101 and 102, the structure shown in FIG. 9 is identical to that shown in FIG. 1. However, the part under the insulating layer 101 in the structure shown in FIG. 9 is different from that in FIG. 1.

An insulating layer 105 is formed between the semiconductor substrate 500 and the insulating layer 101 and a floating electrode 211 is formed in the boundary between the insulating layers 101 and 105. That is, the floating electrode 211 is located on the side of the electrode 200 opposite the floating electrode 201. Such a structure can be obtained by, for example, successively forming the insulating layer 105, the floating electrode 211 and the insulating layer 101 on the semiconductor substrate 500.

A high-potential interconnect cross section in which the floating electrode 201 is located on the side of the electrode 200 opposite the semiconductor substrate 500, exists at some position of the extending electrode 200. Of course, in the high-potential interconnect cross section at every position of the extending electrode 200, the floating electrode 201 may be located on the side of the electrode 200 opposite the semiconductor substrate 500. Further, a high-potential interconnect cross section in which the floating electrode 211 is located on the same side of electrode 200 as the semiconductor substrate 500, exists at some position of the extending electrode 200. Of course, in the high-potential interconnect cross section at every position of the extending electrode 200, the floating electrode 211 may be located on the same side of the electrode 200 as the semiconductor substrate 500. Further, it is not necessary to provide a high-potential interconnect cross section where all the floating electrodes 201 and 211 and the electrode 200 appear. However, as shown in FIG. 9, such a high-potential interconnect cross section which includes all those electrodes may exist.

In this preferred embodiment, the electrode 202 and the floating electrode 211 are coupled together by an electrostatic capacitance C11, the electrode 203 and the floating electrode 211 are coupled together by an electrostatic capacitance C12, and the electrode 200 and the floating electrode 211 are coupled together by an electrostatic capacitance C13. Thus, like the floating electrode 201 and the electrodes 202 and 203, the floating electrode 211 and the electrodes 202 and 203 can increase dielectric strength and can shield the electric field from the electrode 200. Besides, such functions can also be achieved by the floating electrode 201 and the electrodes 202 and 203; thus, the effect of the first preferred embodiment becomes more prominent.

Of course, also in this preferred embodiment, the electrode 203 is not an absolute necessity and thus can be omitted. In that case, the electrostatic capacitances C2 and C12 in the above description are treated as zero. Further, the elevation angles of the widthwise edges of the floating electrode 201 from the near widthwise edges of the electrode 200 should preferably be not more than 45 degrees. Similarly, elevation angles of the widthwise edges of the floating electrode 211 from the near widthwise edges of the electrode 200 should preferably be not more than 45 degrees.

Fifth Preferred Embodiment

Figure 10:
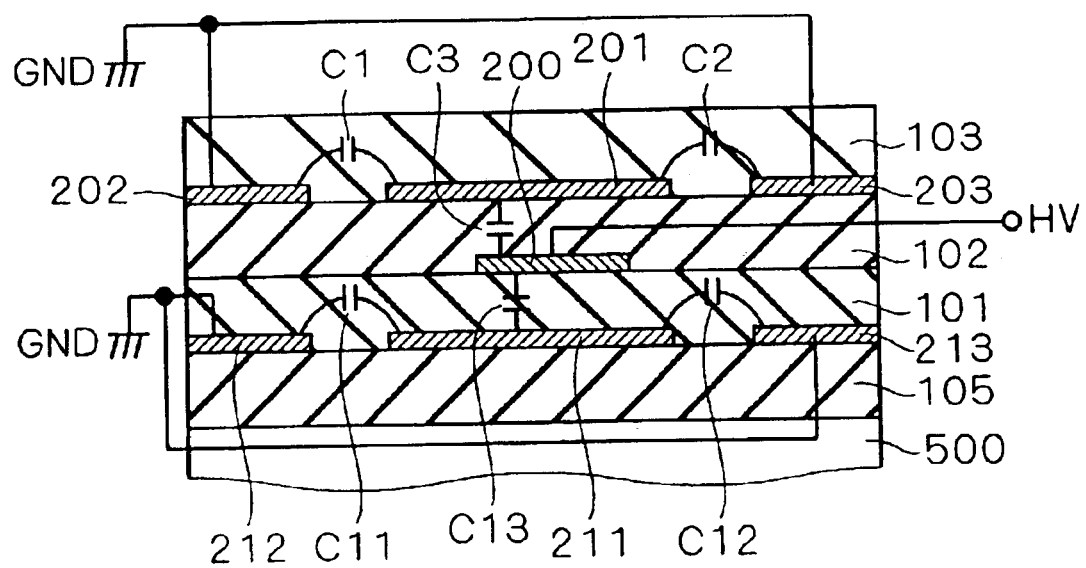
FIG. 10 is a cross-sectional view of a semiconductor device according to a fifth preferred embodiment of the present invention.

FIG. 10 is a cross-sectional view of a semiconductor device according to a fifth preferred embodiment of the present invention. As for the part above the boundary between the insulating layers 101 and 102, the structure shown in FIG. 10 is identical to that shown in FIG. 5. However, the part under the insulating layer 101 in the structure shown in FIG. 10 is different from that in FIG. 5.

The insulating layer 105 is formed between the semiconductor substrate 500 and the insulating layer 101, and floating electrode 211 and electrodes 212 and 213 are formed in a same layer in the boundary between the insulating layers 101 and 105. Such a structure can be obtained by, for example, successively forming the insulating layer 105, the floating electrode 211 and the electrodes 212, 213, and the insulating layer 101 on the semiconductor substrate 500.

The electrodes 212 and 213 are applied with the low potential GND. A high-potential interconnect cross section in which the floating electrode 201 is located on the side of the electrode 200 opposite the semiconductor substrate 500, exists at some position of the extending electrode 200. Of course, in the high-potential interconnect cross section at every position of the extending electrode 200, the floating electrode 201 may be located on the side of the electrode 200 opposite the semiconductor substrate 500. Further, a high-potential interconnect cross section in which the floating electrode 211 is located on the same side of the electrode 200 as the semiconductor substrate 500, exists at some position of the extending electrode 200. Of course, in the high-potential interconnect cross section at every position of the extending electrode 200, the floating electrode 211 may be located on the same side of the electrode 200 as the semiconductor substrate 500. Further, it is not necessary to provide a high-potential interconnect cross section where all the floating electrodes 201 and 211 and the electrode 200 appear. However, as shown in FIG. 10, such a high-potential interconnect cross section which includes all those electrodes may exist.

In this preferred embodiment, the electrode 212 and the floating electrode 211 are coupled together by the electrostatic capacitance C11, the electrode 213 and the floating electrode 211 are coupled together by the electrostatic capacitance C12, and the electrode 200 and the floating electrode 211 are coupled together by the electrostatic capacitance C13. Thus, like the floating electrode 201 and the electrodes 202 and 203, the floating electrode 211 and the electrodes 212 and 213 can increase dielectric strength and can shield the electric field from the electrode 200. Besides, such functions can also be achieved by the floating electrode 201 and the electrodes 202 and 203; therefore, the effect of the first preferred embodiment becomes more prominent.

Of course, also in this preferred embodiment, the electrodes 203 and 213 are not an absolute necessity and thus can be omitted. In that case, the electrostatic capacitances C2 and C12 in the above description are treated as zero. Further, the elevation angles of the widthwise edges of the floating electrode 201 from the near widthwise edges of the electrode 200 should preferably be not more than 45 degrees. Similarly, the elevation angles of the widthwise edges of the floating electrode 211 from the near widthwise edges of the electrode 200 should preferably be not more than 45 degrees.

Sixth Preferred Embodiment

Figure 11:
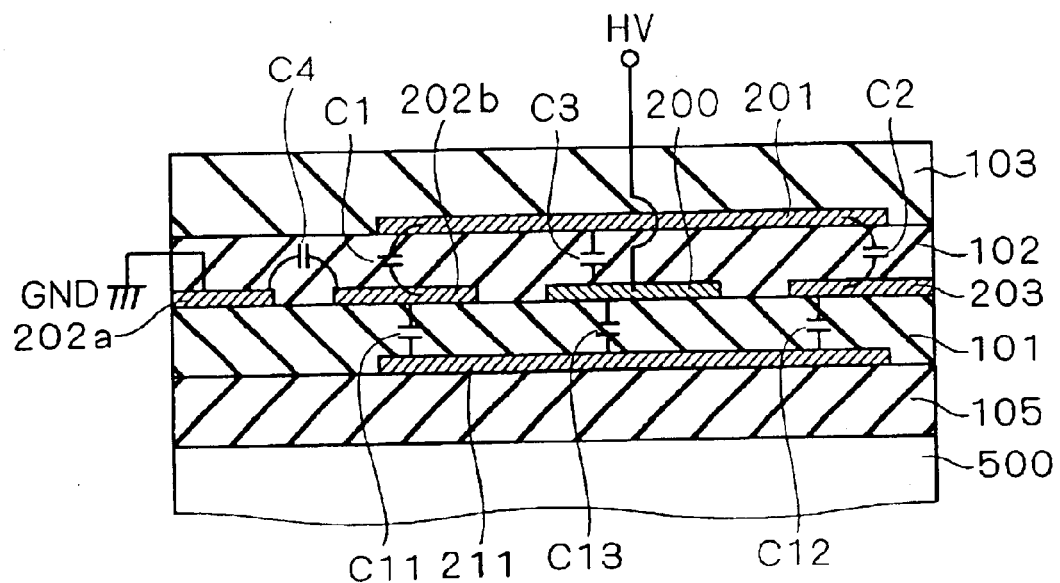
FIG. 11 is a cross-sectional view of a semiconductor device according to a sixth preferred embodiment of the present invention.

FIG. 11 is a cross-sectional view of a semiconductor device according to a sixth preferred embodiment of the present invention. The structure shown in FIG. 11 is configured such that the electrode 202 shown in FIG. 9 is divided into the electrode 202a and the floating electrode 202b and the low potential GND is applied to the electrode 202a. Thus, the same effects as described in the third and fourth preferred embodiments can be achieved.

Figure 12:
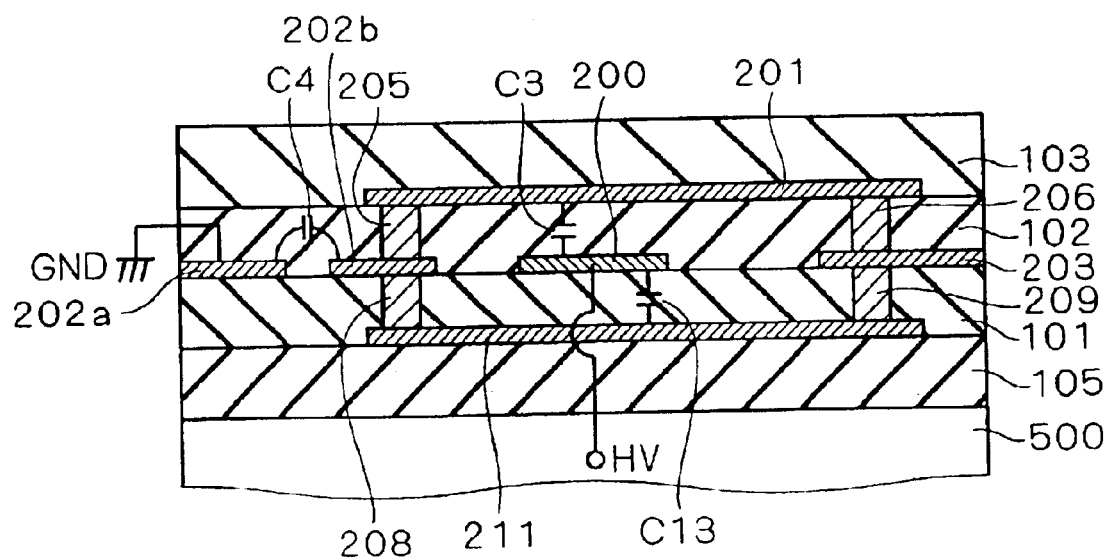
FIG. 12 is a cross-sectional view showing a modification of the sixth preferred embodiment of the present invention.

FIG. 12 is a cross-sectional view showing a modification of this preferred embodiment. The floating electrodes 201 and 202b are connected to each other through the conductive plug 205, and the floating electrodes 201 and 203 are connected to each other through the conductive plug 206. The conductive plugs 205 and 206 extend through the insulating layer 102 in the direction of thickness of the insulating layer 102. The floating electrodes 211 and 202b are connected to each other through a conductive plug 208, and the floating electrode 211 and the electrode 203 are connected to each other through a conductive plug 209. The conductive plugs 208 and 209 extend through the insulating layer 101 in the direction of thickness of the insulating layer 101.

This modification may be regarded as a modification of the structure shown in FIG. 8. That is, the structure shown in FIG. 12 can be obtained by interposing the insulating layer 105 between the semiconductor substrate 500 and the insulating layer 101 and by additionally forming the floating electrode 211 and the conductive plugs 208 and 209 as described above, in the structure shown in FIG. 8.

In this modification, there exists a high-potential interconnect cross section in which a continuous conductive material appears to enclose the electrode 200. However, instead of being applied with the potential GND as in Japanese Patent Application Laid-open No. 8-274167, the conductive material is connected through the electrostatic capacitance C4 to the electrode 202a which is applied with the potential GND. Therefore, the semiconductor device according to this preferred embodiment, as previously described, is more advantageous in terms of an increase in dielectric strength.

Seventh Preferred Embodiment

Figure 13:
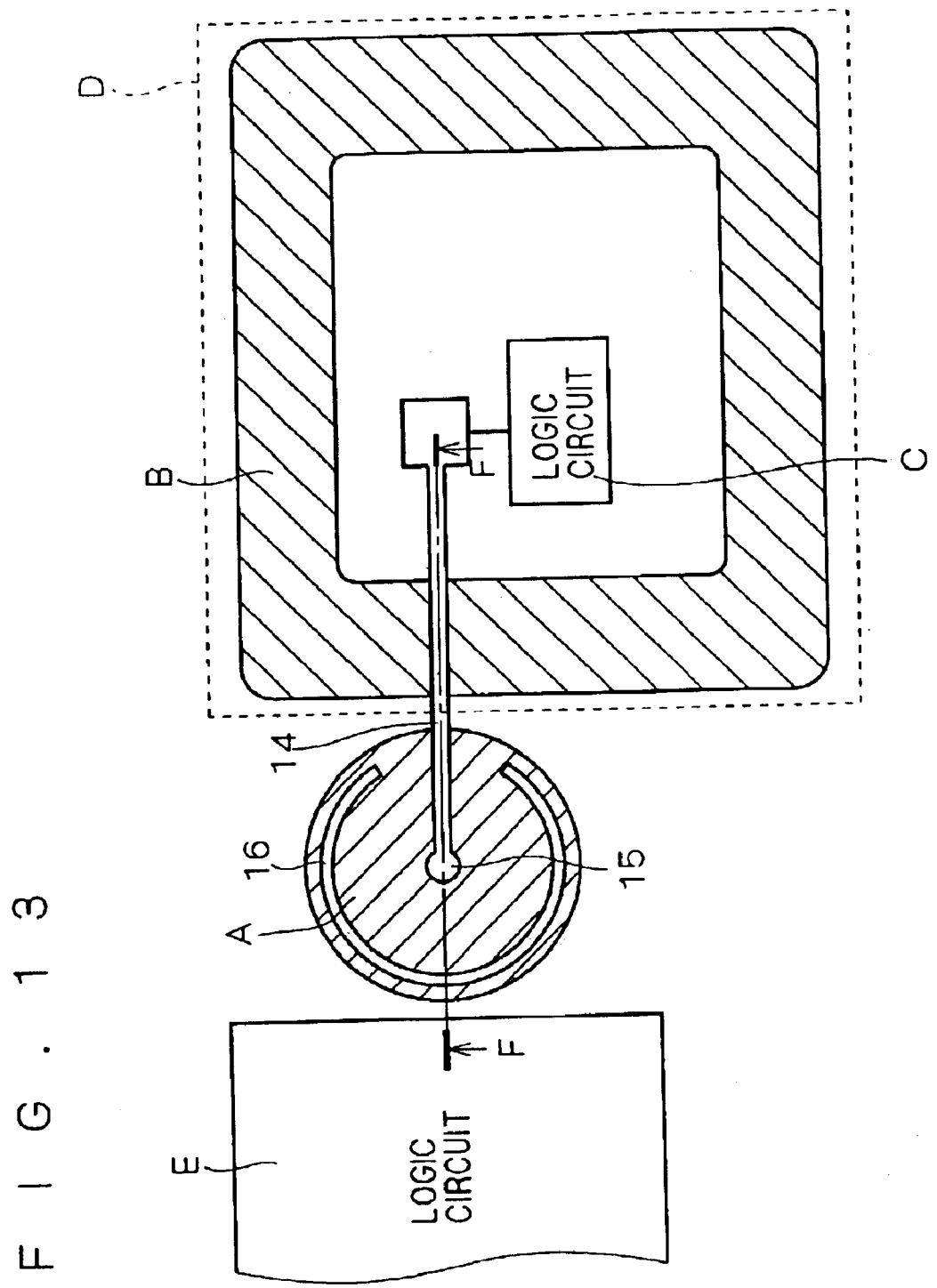
FIG. 13 is a plan view showing a structure of a semiconductor device according to a seventh preferred embodiment of the present invention.
Figure 14:
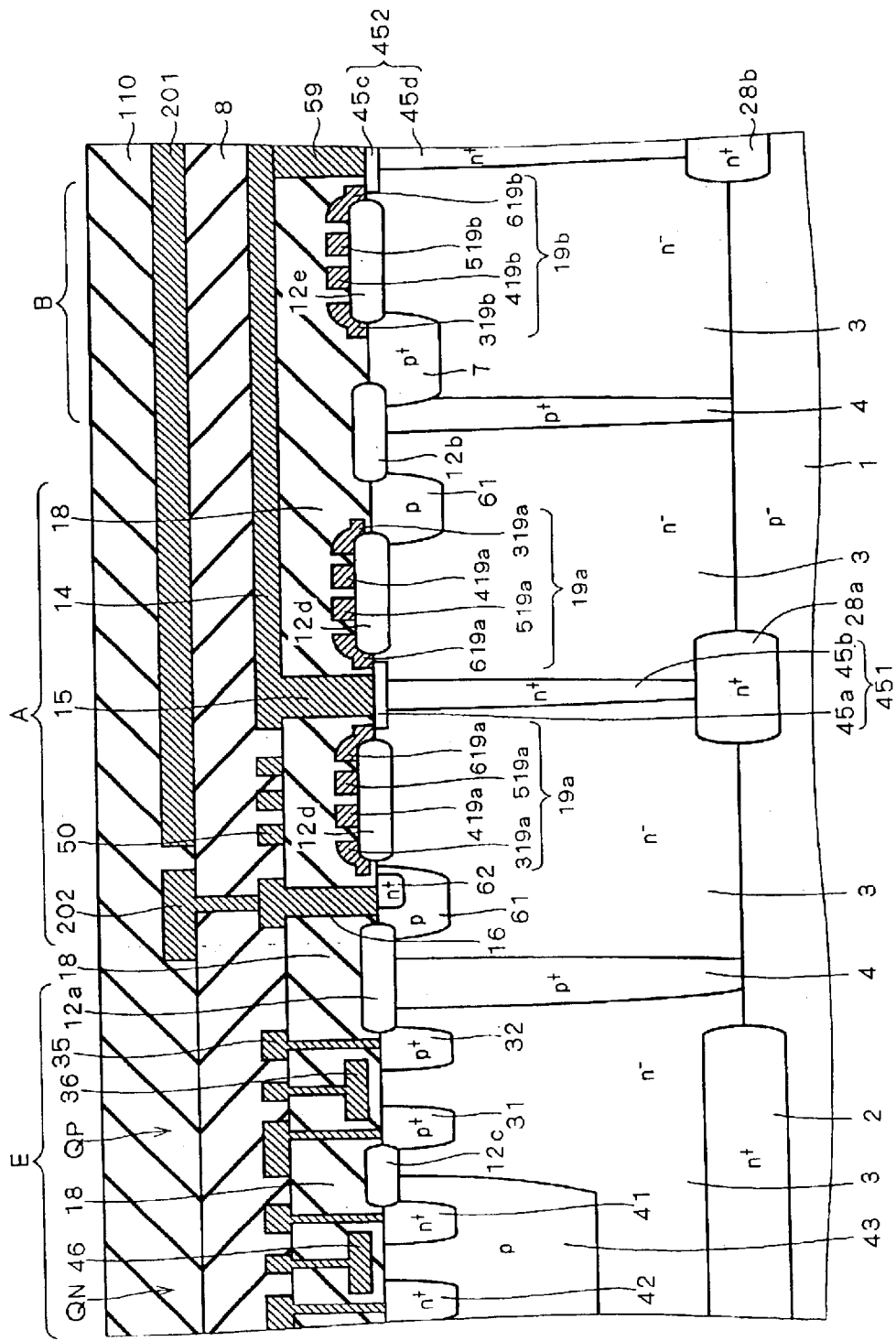
FIG. 14 is a cross-sectional view showing the structure of the semiconductor device according to the seventh preferred embodiment of the present invention.

FIG. 13 is a plan view illustrating a structure of the semiconductor device according to a seventh preferred embodiment of the present invention. FIG. 14 is a cross-sectional view taken along the arrowed line F13 F of FIG. 13. To avoid complexity of the drawing, FIG. 13 does not show the structure above an interlayer insulation film 8 in FIG. 14 and illustrates only drain and source electrodes 15 and 16 of a high voltage NMOS transistor A and a metal interconnect line 14 connected thereto, out of the electrodes formed on an interlayer insulation film 18.

As shown in FIG. 14, an n⁻ semiconductor layer 3 is formed on a p⁻ semiconductor substrate 1. Isolation insulating films 12a, 12b, 12c, 12d and 12e are formed in the surface of the n⁻ semiconductor layer 3. The isolation insulating film 12a separates the high voltage NMOS transistor A and a logic circuit E which operates at a low potential. As shown in FIG. 13, a reduced surface field (RESURF) isolation region B is formed to enclose another logic circuit C, both of which form a high-potential island D. A RESURF isolation technique is introduced in, for example, U.S. Pat. No. 4,292,642.

FIG. 14 shows PMOS and NMOS transistors QP and QN forming a CMOS transistor in the logic circuit E. These transistors are spaced apart from the metal interconnect line 14 in a direction of extension of the interlayer insulation films 8 and 18 and separated from each other by the isolation insulating film 12c.

In the logic circuit E, a p⁺ impurity region 4 extending through the n⁻ semiconductor layer 3 to the p⁻ semiconductor substrate 1 is formed under the isolation insulating film 12a. The p⁺ impurity region 4 and the isolation insulating film 12a isolate the n⁻ semiconductor layer 3 in the high voltage NMOS transistor A and the n⁻ semiconductor layer 3 in the logic circuit E from each other. In the logic circuit E, an n⁺ buried impurity region 2 is selectively formed in the boundary between the p⁻ semiconductor substrate 1 and the n⁻ semiconductor layer 3. In the surface of the n⁻ semiconductor layer 3 above the n⁺ buried impurity region 2, a p well 43 is spaced away from the n⁺ buried impurity region 2.

The transistor QN is formed in the p well 43. In the surface of the p well 43, n⁺ impurity regions 41 and 42 serving respectively as drain and source are spaced from each other. A gate electrode 46 is formed above the p well 43 between the n⁺ impurity regions 41 and 42. The transistor QP is formed in the surface of the n⁻ semiconductor layer 3 on the side of the isolation insulating film 12c opposite the p well 43. In the surface of the n⁻ semiconductor layer 3 in this position, p⁺ impurity regions 31 and 32 serving respectively as drain and source are spaced from each other. A gate electrode 36 is formed above the n⁻ semiconductor layer 3 between the p⁺ impurity regions 31 and 32. The transistors QN and QP are covered with the interlayer insulation film 18. In the drawing, gate insulating films between the n⁻ semiconductor layer 3 and the gate electrode 36 and between the p well 43 and the gate electrode 46 are included in and shown as the interlayer insulation film 18.

The high voltage NMOS transistor A and the RESURF isolation region B are located on the side of the interlayer insulation films 8 and 18 opposite the electrode 201 and isolated from each other by the isolation insulating film 12b. More precisely, the isolation insulating films 12a and 12b, although separately shown in FIG. 14, are coupled to each other and located to enclose the high NMOS transistor A in FIG. 13. The p$^+$ impurity region 4 extending through the n$^-$ semiconductor layer 3 to the p$^-$ semiconductor substrate 1 is also formed under the isolation insulating film 12b.

In a central portion of the high voltage NMOS transistor A in plan view, an n$^+$ buried impurity region 28a is selectively formed in the boundary between the p$^-$ semiconductor substrate 1 and the n$^-$ semiconductor layer 3. An n$^+$ impurity region 45a is formed in the surface of the n$^-$ semiconductor layer 3 above the n$^+$ buried impurity region 28a. An n$^+$ impurity region 45b is formed through the n$^-$ semiconductor layer 3 to connect the n$^+$ impurity region 45a and the buried impurity region 28a. The n$^+$ impurity regions 45a and 45b together form an n$^+$ impurity region 451 which serves as the drain of the high voltage NMOS transistor A.

The n$^+$ impurity region 451 is enclosed in plan view by the isolation insulating film 12d and further, a p impurity region 61 is formed on the surface of the n$^-$ semiconductor layer 3 to enclose the isolation insulating film 12d in plan view. In the surface of the p impurity region 61, an n$^+$ impurity region 62 is selectively formed. The p impurity region 61 and the n$^+$ impurity region 62 serve respectively as the backgate and source of the high voltage NMOS transistor A. However, the n$^+$ impurity region 62 is preferably not formed in a portion of the surface of the p impurity region 61 which is located below the metal interconnect line 14; thus, in such a portion of the surface of the p impurity region 61 in FIG. 14, the n$^+$ impurity region 62 is not formed. This is because, since a high potential is applied to the metal interconnect line 14 connected to the drain electrode 15, the presence of the n$^+$ impurity region 62 below the metal interconnect line 14 is more likely to form a parasitic transistor.

The source electrode 16 is connected to both the p impurity region 61 and the n$^+$ impurity region 62. The drain electrode 15 is connected to the n$^+$ impurity region 45a.

Gate electrode groups 19a are formed on the isolation insulating film 12d. The gate electrode groups 19a each include gate electrodes 319a, 419a, 519a and 619a located along a direction from the p impurity region 61 toward the n$^+$ impurity region 451 in this order. The gate electrode 319a covers above one edge of the p impurity region 61 without contact therewith and it is applied with a gate potential. The gate electrode 619a is in contact with one edge of the n$^+$ impurity region 45a. The gate electrodes 419a and 519a are floating electrodes which are interposed between the gate electrodes 319a and 619a to provide capacitive coupling therewith, thereby carrying out the function of relieving an electric field occurring in the surface of the isolation insulating film 12d and based on a potential difference between the source and drain. Such a technique for relieving an electric field is introduced in, for example, U.S. Pat. No. 5,455,439.

The n$^+$ impurity region 45a, the p impurity region 61, the n$^+$ impurity region 62 and the gate electrode groups 19a are covered with the interlayer insulation film 18. However, the source electrode 16 and the drain electrode 15 extend through the interlayer insulation film 18. Here, gate insulating films between the gate electrode 319a and the p impurity regions 61 or the n$^+$ impurity region 62 are included in and shown as the interlayer insulation film 18.

A group of floating electrodes 50 located on the interlayer insulation film 18 above the gate electrode group 19a carries out the function of relieving an electric field occurring in the surface of the interlayer insulation film 18 and based on a potential difference between the source and drain.

In the RESURF isolation region B, a p$^+$ impurity region 7 is selectively formed in the surface of the n$^-$ semiconductor layer 3 and in contact with the p$^+$ impurity region 4 formed under the isolation insulating film 12b. Further, an n$^+$ impurity region 452 is formed on the side of the RESURF isolation region B opposite the high voltage NMOS transistor A. The p$^+$ impurity region 7 and the n$^+$ impurity region 452 are separated from each other by the isolation insulating film 12e. The n$^+$ impurity region 452 includes an n$^+$ impurity region 45c formed in the surface of the n$^-$ semiconductor layer 3 and an n$^+$ impurity region 45d extending through the n$^-$ semiconductor layer 3. Under the n$^+$ impurity region 45d, an n$^+$ buried impurity region 28b is selectively formed in the boundary between the p$^-$ semiconductor substrate 1 and the n$^-$ semiconductor layer 3. The n$^+$ impurity region 45d connects the n$^+$ impurity region 45c and the n$^+$ buried impurity region 28b.

A gate electrode group 19b is formed on the isolation insulating film 12e. The gate electrode group 19b includes gate electrodes 319b, 419b, 519b and 619b which are located along a direction from the p$^+$ impurity region 7 toward the n$^+$ impurity region 452 in this order. The gate electrode 319b is in contact with one edge of the p$^+$ impurity region 7 and the gate electrode 619b is in contact with one edge of the n$^+$ impurity region 45c. The gate electrodes 419b and 519b are floating electrodes which are interposed between the gate electrodes 319b and 619b to provide capacitive coupling therewith, thereby carrying out the function of relieving an electric field occurring in the surface of the isolation insulating film 12e and based on a potential difference between the source and drain.

The n$^+$ impurity region 45c, the p$^+$ impurity region 7 and the gate electrode group 19b are covered with the interlayer insulation film 18. However, the n$^+$ impurity region 45c is connected to the metal interconnect line 14 through a plug 59 which extends through the interlayer insulation film 18.

The metal interconnect line 14, the drain electrode 15, the source electrode 16 and the interlayer insulation film 18 are covered with the interlayer insulation film 8. The floating electrode 201 and the electrode 202 are formed on the interlayer insulation film 8. The electrode 202 extends through the interlayer insulation film 8 and is connected to the source electrode 16. The floating electrode 201 provides capacitive coupling with the electrode 202. The interlayer insulation film 8, the floating electrode 201 and the electrode 202 are covered with an insulating layer 110.

Figure 15:
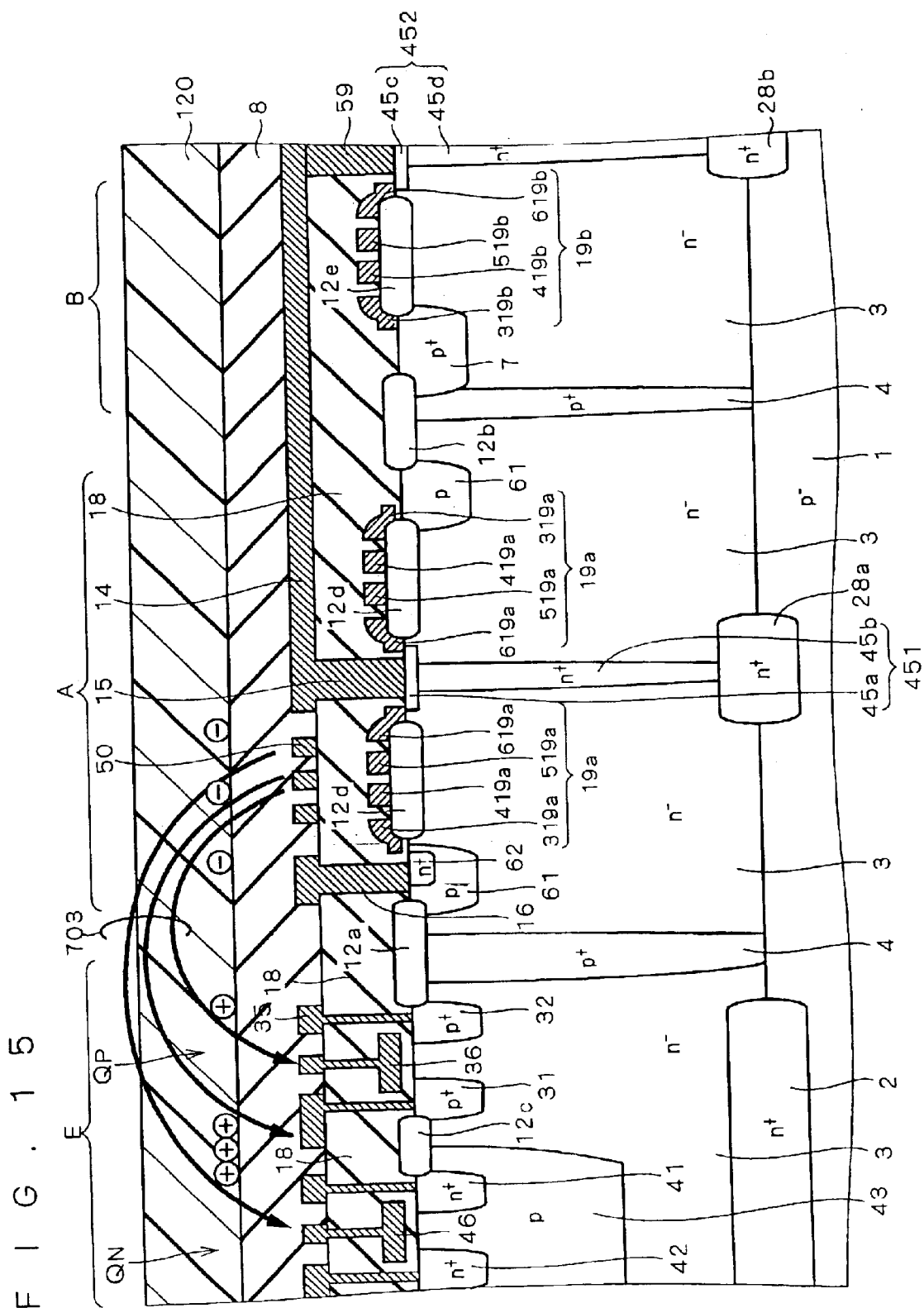
FIGS. 15 through 17 are cross-sectional views for explaining the effect of the seventh preferred embodiment of the present invention.
Figure 16:
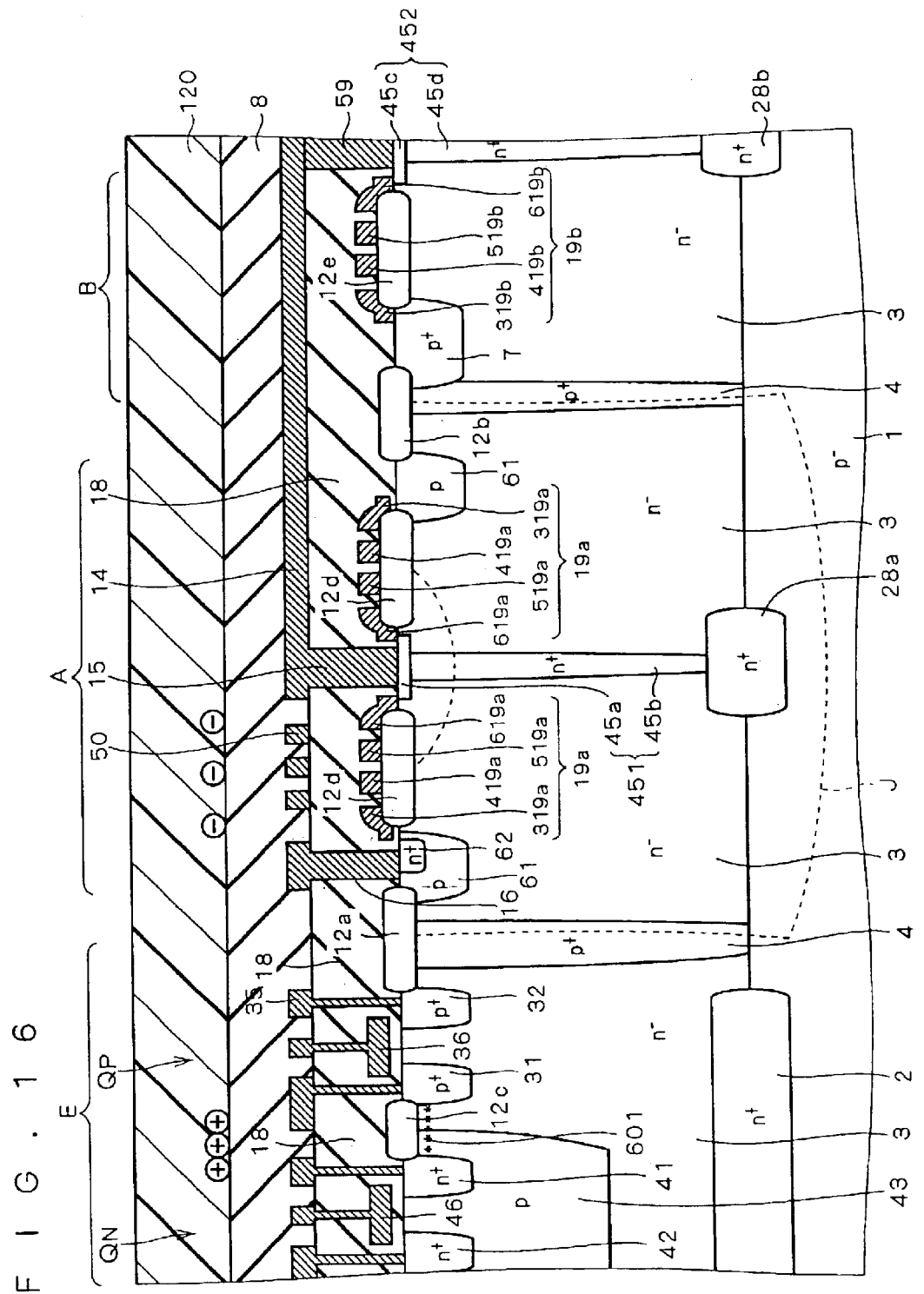
Figure 17:
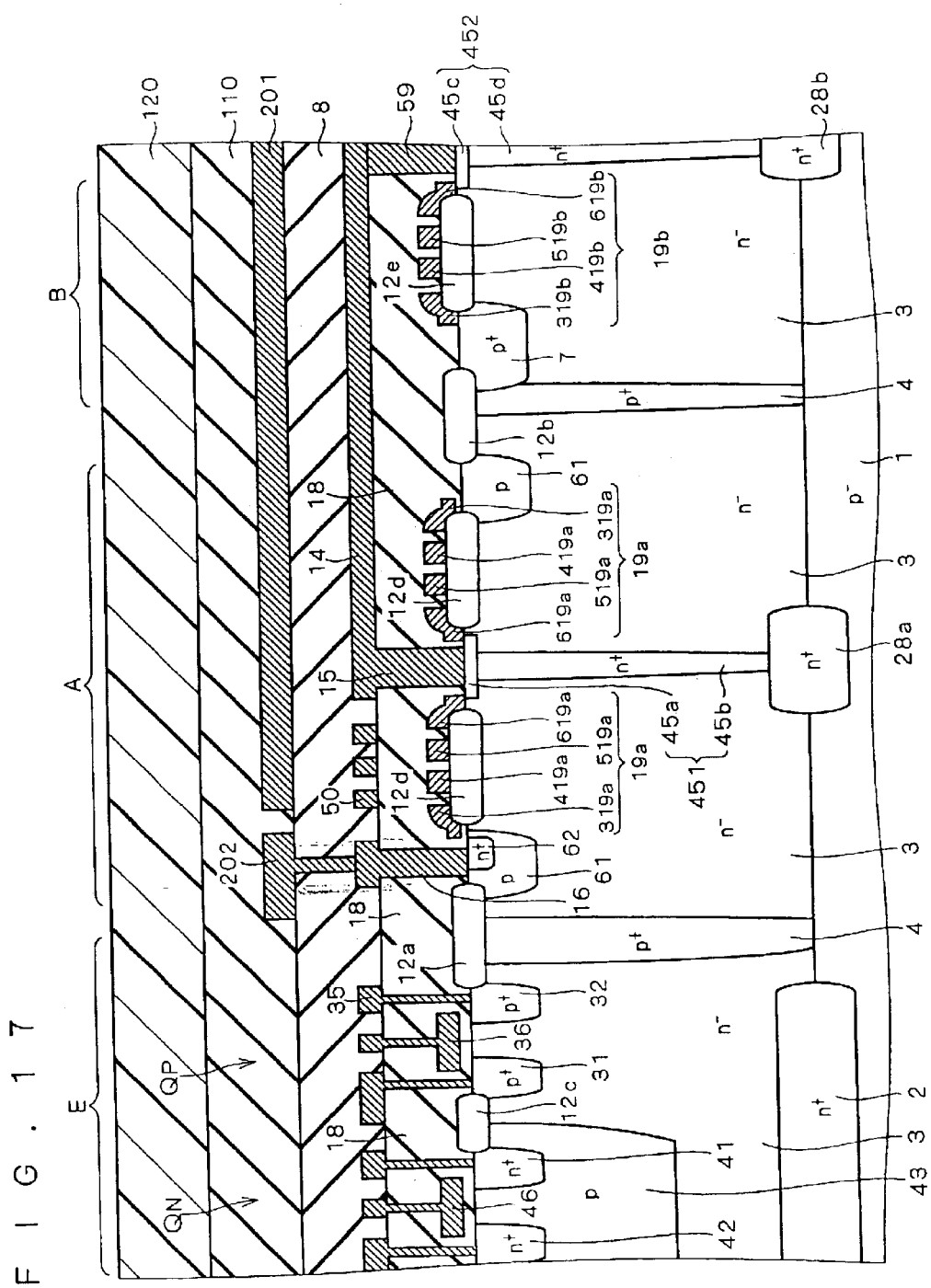

FIGS. 15 through 17 are cross-sectional views for explaining the effect of this preferred embodiment. FIGS. 15 and 16 illustrates the case without application of the present invention, and FIG. 17 illustrates the case with application of the present invention. The structure shown in FIG. 15 is such that the interlayer insulation film 8 in the structure shown in FIG. 14 is covered with the mold resin 120, without adopting the floating electrode 201, the electrode 202 and the insulating layer 110. Thus, an electric field 703 from the drain electrode 15 and the floating electrode 50 to the transistors QN and QP brings about polarization of the mold resin 120. FIG. 16 illustrates a problem caused by such polarization. Similar to the case of FIG. 3, the region 601 with a changed band structure is formed. Further, the edge of a depletion layer J closer to the isolation insulating film 12d is forced away from the drain electrode 15, which prevents extension of the depletion layer J in the n$^-$ semiconductor layer 3. This brings about electric field concentration under the isolation insulating film 12d and hence results in a reduction in the breakdown voltage of the high voltage NMOS transistor A.

On the other hand, in the structure of FIG. 17 in which the insulating layer 110 in FIG. 14 is covered with the mold resin 120, an electric field from the drain electrode 16 and the floating electrodes 50 can be shielded by the floating electrode 201. This prevents the formation of the region 601 and avoids prevention of extension of the depletion layer J.

Eighth Preferred Embodiment

Figure 18:
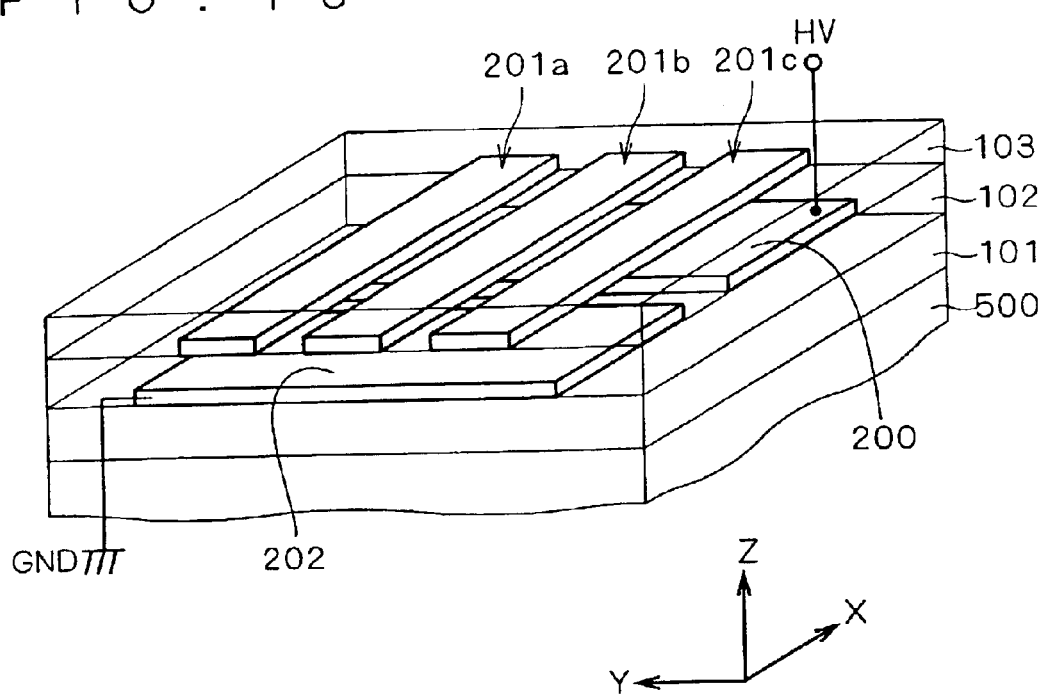
FIG. 18 is a perspective view illustrating a basic concept of an eighth preferred embodiment of the present invention.

FIG. 18 is a perspective view illustrating a basic concept of this preferred embodiment. The semiconductor substrate 500 and the insulating layers 101, 102 and 103 are deposited from bottom in this order, and the electrode 202 and the electrode 200 extending along the Y direction are formed on the insulating layer 101 and covered with the insulating layer 102. Further, floating electrodes 201a, 201b and 201c extending in the X direction are arranged along the Y direction on the insulating layer 102. The floating electrodes 201a, 201b and 201c are all covered with the insulating layer 103. The electrode 202 is applied with the potential GND and the electrode 200 is applied with the potential HV. The X and Y directions are different directions both perpendicular to the Z direction. The Z direction is an upward direction. For ease of understanding the arrangement of the respective electrodes, the semiconductor substrate 500 and the insulating layers 101, 102 and 103 are drawn transparently in FIG. 18.

In the structure shown in FIG. 18, a high-potential interconnect cross section is perpendicular to the Y direction and not all high-potential interconnect cross sections include a floating electrode located above the electrode 200. However, for example in a high-potential interconnect cross section which includes any one of the floating electrodes 201a, 201b and 201c, that floating electrode is always located above the electrode 200. Thus, the same effect as described in the first preferred embodiment can be achieved.

Figure 19:
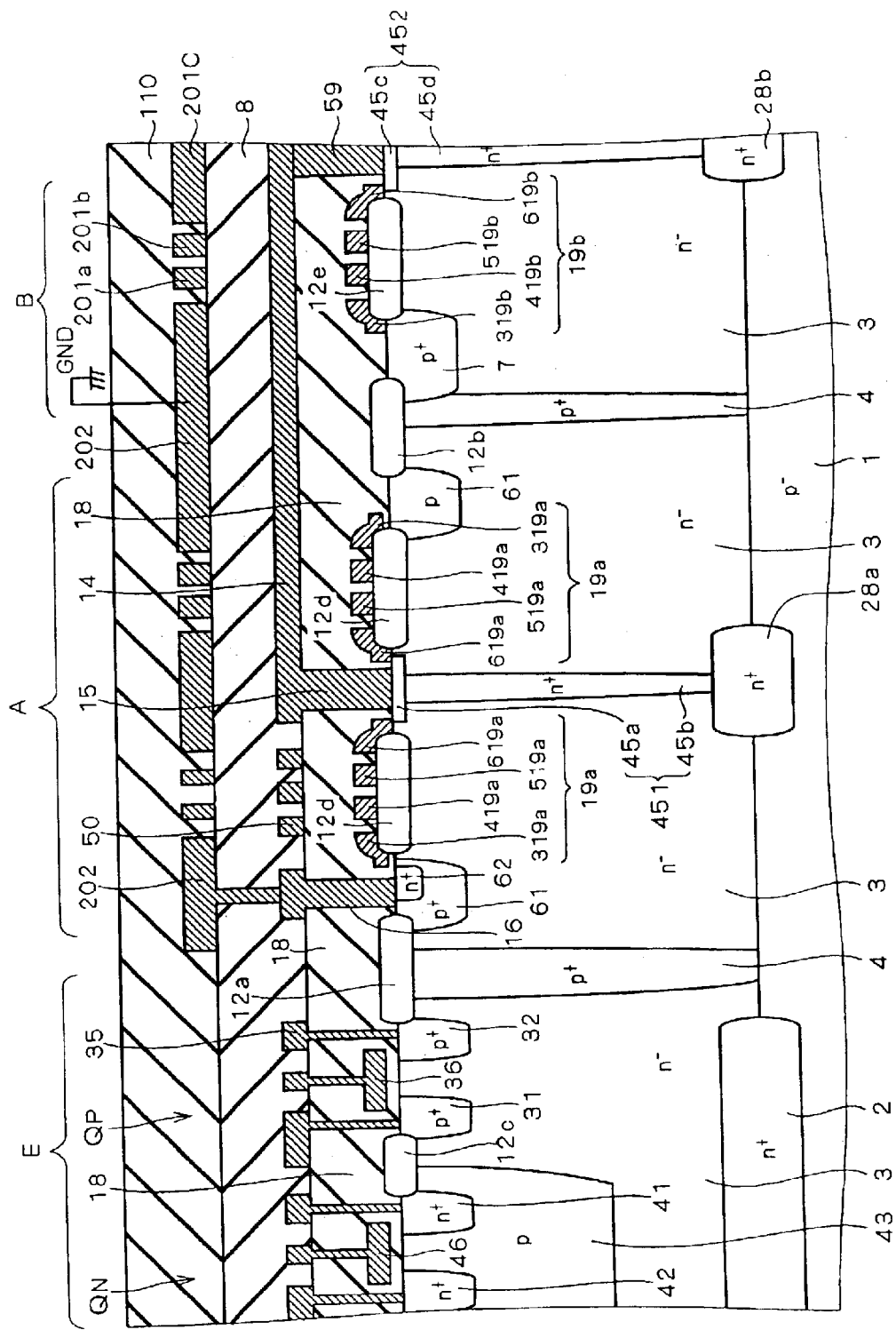
FIG. 19 is a cross-sectional view showing a structure of a semiconductor device according to the eighth preferred embodiment of the present invention.

In this way, arranging a plurality of floating electrodes along the direction of extension of the electrode applied with a high potential is a preferred form of the present invention in applying the present invention to the RESURF isolation region B described in the seventh preferred embodiment. FIG. 19 is a cross-sectional view showing a structure of the semiconductor device according to this preferred embodiment, in which the floating electrode 201 in the structure shown in FIG. 14 is divided into the plurality of floating electrodes 201a, 201b and 201c arranged along the direction of extension of the metal interconnect line 14. Capacitive coupling is established between the floating electrode 201a and the electrode 202, between the floating electrodes 201a and 201b, and between the floating electrodes 201b and 201c. The potential GND is, for example, applied to the gate electrode 319b as well as the electrode 202. Even when in this way, the plurality of floating electrodes provide direct or indirect capacitive coupling with the electrode applied with a low potential and cover the electrode applied with a high potential, it is possible to increase dielectric strength and to shield an electric field as described in the sixth preferred embodiment.

Figure 20:
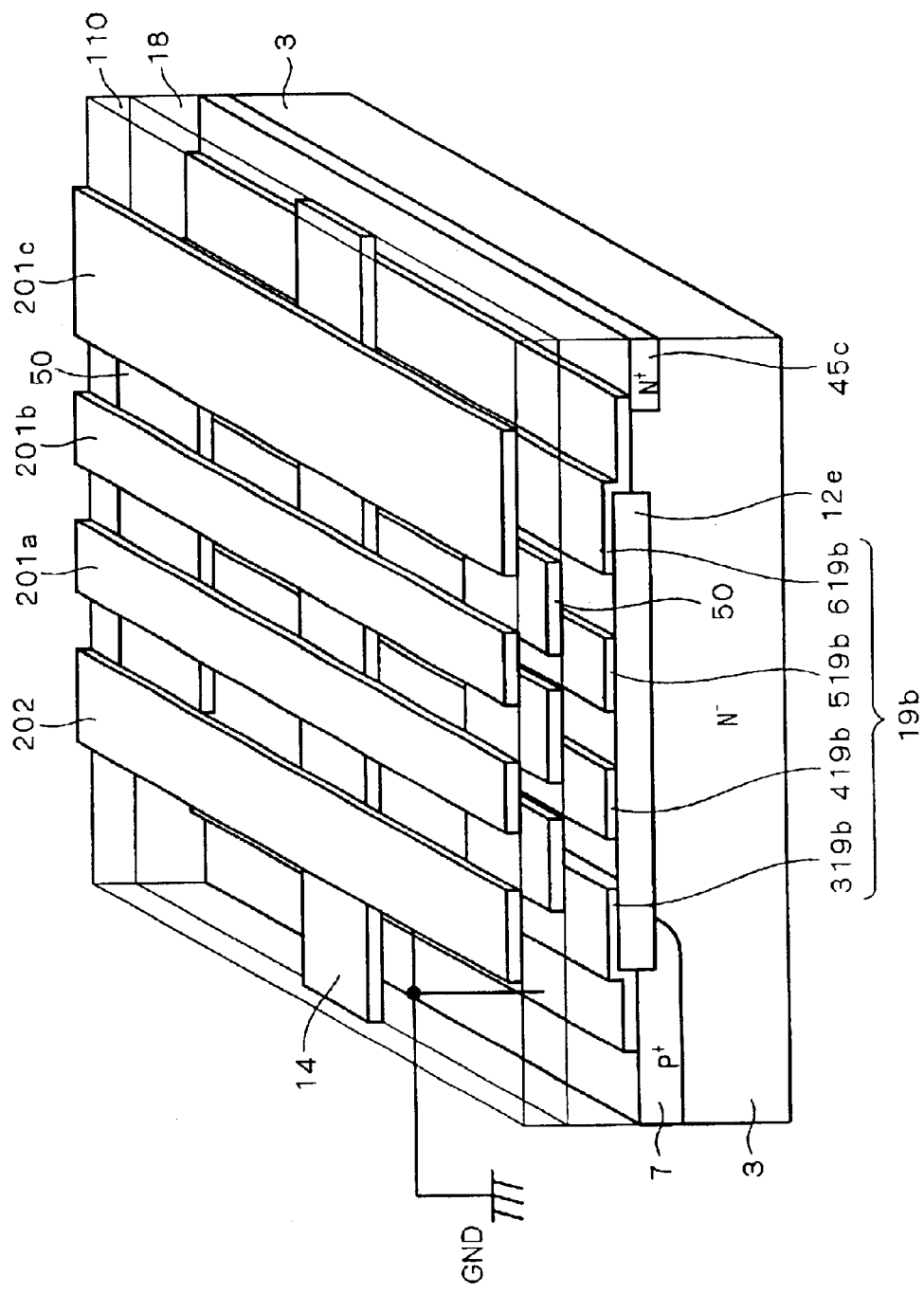
FIG. 20 is a perspective view showing the structure of the semiconductor device according to the eighth preferred embodiment of the present invention.

FIG. 20 is a perspective view showing the periphery of the gate electrode group 19b. For ease of understanding the arrangement of the respective electrodes, the interlayer insulation film 18 and the insulating layer 110 are drawn transparently also in FIG. 20. For example, the floating electrodes 201a, 201b and 201c are arranged respectively above the gate electrodes 419b, 519b and 619b. Thus, as a high-potential interconnect cross section with respect to the metal interconnect line 14, there is, for example, a cross section including the floating electrode 201a, the metal interconnect line 14 and the gate electrode 419b. In that case, the floating electrode 201a, the gate electrode 419b and the metal interconnect line 14 in that cross section correspond respectively to the floating electrode 201, the floating electrode 211 and the electrode 200 shown in FIG. 10. Also, the electrode 202 and the gate electrode 319b in FIG. 20 correspond respectively to the electrode 202 and the electrode 212 in FIG. 10.

Further, the floating electrode 50 can be located such that its edges are located in a space between the floating electrode 201a and the gate electrode 419b. In this case, as a high-potential interconnect cross section with respect to the metal interconnect line 14, there is, for example, a cross section including the floating electrode 50 as well as the floating electrode 201a, the metal interconnect line 14 and the gate electrode 419b. In that case, the floating electrode 201a, the gate electrode 419b and the metal interconnect line 14 in that cross section correspond respectively to the floating electrode 201, the floating electrode 211 and the electrode 200 shown in FIG. 11, and the floating electrode 50 corresponds to the floating electrodes 202b and 203 in FIG. 11.

In this preferred embodiment, the metal interconnect line 14 applied with a high potential is not entirely covered with the floating electrode for shielding in the direction of extension of the metal interconnect line 14. This is desirable for not forming a parasitic transistor especially under the metal interconnect line 14. From a similar point of view, the electrode for shielding located above the isolation insulating film 12d is preferably discontinuous and has space in places as shown in FIG. 19.

The floating electrodes 201a, 201b and 201c need not necessarily establish capacitive coupling therebetween and they may be connected to each other in places not shown in FIG. 19. Or, they may be connected to the electrode 202.

Figure 21:
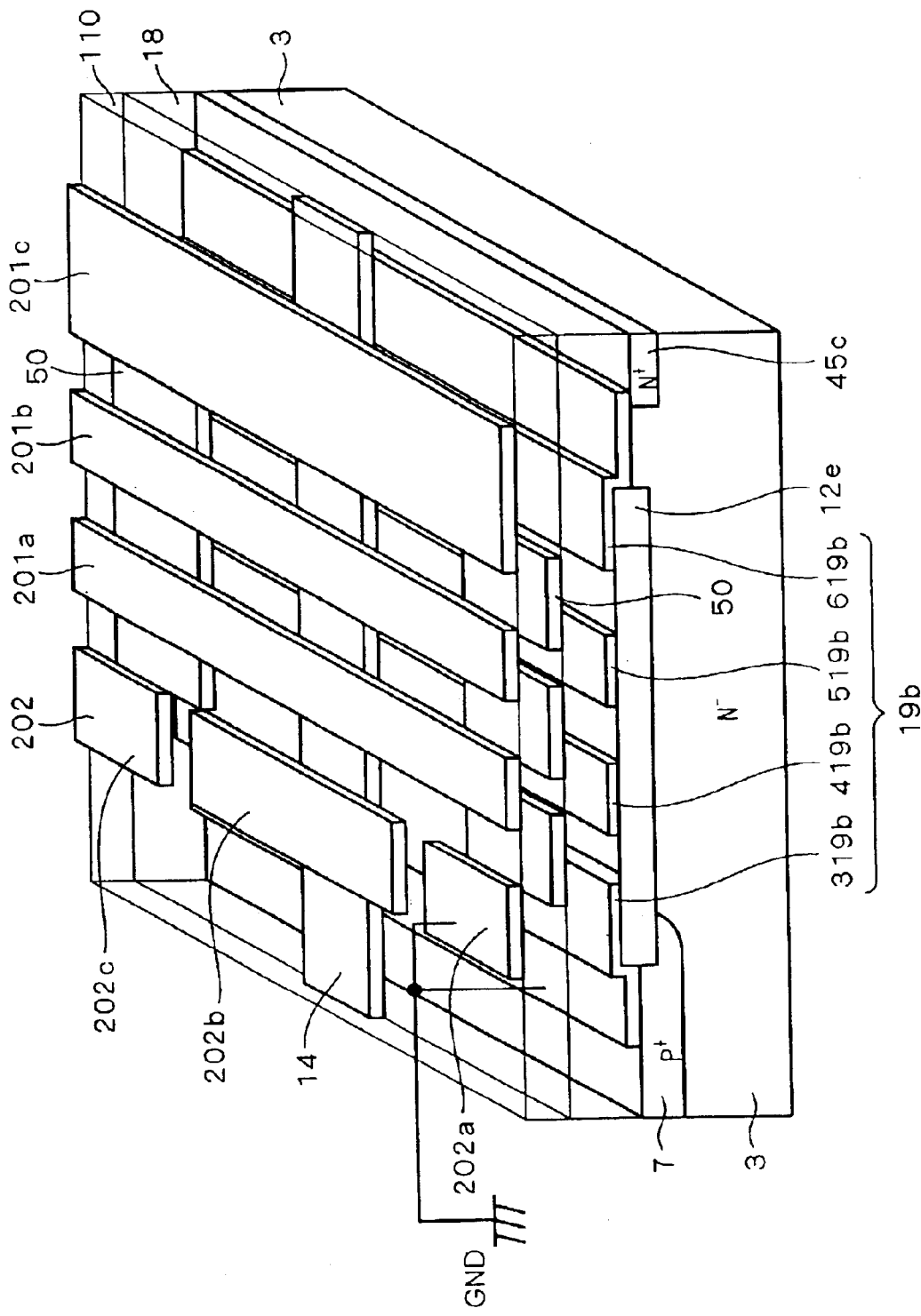
FIG. 21 is a perspective view showing a modification of the eighth preferred embodiment of the present invention.

FIG. 21 is a perspective view showing a modification of this preferred embodiment. The structure shown in FIG. 21 is configured such that the electrode 202 in the structure shown in FIG. 20 is divided into the electrode 202a and the floating electrodes 202b and 202c. The potential GND is applied to the electrode 202a and the gate electrode 319b, and capacitive coupling is established between the floating electrode 202b and the electrode 202a and between the floating electrodes 202b and 202c. Since the floating electrodes 201a, 201b, 201c 202b and 202c which make direct or indirect capacitive coupling with the electrode 202a applied with the low potential GND cover above the metal interconnect line 14 applied with a high potential, it is possible to increase dielectric strength and to shield the electric field.

In each of the aforementioned preferred embodiments, the electrodes and the floating electrodes can be formed of metal.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate;
   an insulating layer formed on said semiconductor substrate;
   a first electrode extending exclusively on a single flat surface of said insulating layer and applied with a first potential;
   a second electrode isolated from the surroundings;
   a third electrode applied with a second potential lower than said first potential and providing capacitive coupling connecting said third electrode with said second electrode, wherein there exists a cross section which is perpendicular to a direction of extension of said first electrode and in which said second electrode is located on the side of said first electrode opposite said semiconductor substrate.

2. The semiconductor device according to claim 1, wherein
said third electrode is located in the same layer as said first electrode.

3. The semiconductor device according to claim 1, wherein
said third electrode is located in the same layer as said second electrode.

4. The semiconductor device according to claim 3, further comprising:
a fourth electrode located on the side of said second electrode opposite said first electrode in said cross section and connected to said third electrode.

5. The semiconductor device according to claim 1, further comprising:
a fourth electrode isolated from the surroundings,
wherein said third electrode provides capacitive coupling connecting said third electrode with said second electrode through said fourth electrode.

6. The semiconductor device according to claim 1, further comprising:
a fourth electrode located in the same layer as said first electrode and connected to said second electrode.

7. The semiconductor device according to claim 1, further comprising:
a fourth electrode located on the side of said first electrode opposite said second electrode in said cross section and providing capacitive coupling connecting said fourth electrode with said third electrode.

8. The semiconductor device according to claim 7, further comprising:
a fifth electrode applied with said second potential and located in the same layer as said fourth electrode.

9. The semiconductor device according to claim 7, further comprising:
a fifth electrode isolated from the surroundings,
wherein said third electrode provides capacitive coupling connecting said third electrode with said fourth electrode through said fifth electrode.

10. The semiconductor device according to claim 1, further comprising:
a fourth electrode located on the side of said first electrode opposite said second electrode in said cross section and connected to said second electrode.

11. The semiconductor device according to claim 1, further comprising:
a CMOS transistor spaced apart from said first electrode along a direction of extension of said insulating layer and operating at a potential lower than said first potential.

12. The semiconductor device according to claim 1, further comprising:
a MOS transistor located on the side of said insulating layer opposite said second electrode and operating at said first potential.

13. The semiconductor device according to claim 12, further comprising:
a RESURF isolation region located on the side of said insulating layer opposite said second electrode and isolating said MOS transistor.

14. The semiconductor device according to claim 13, wherein
said second electrode has a plurality of spaces in a direction of extension of said first electrode.

15. The semiconductor device according to claim 14, wherein
said second electrode is divided into a plurality of second electrodes which are arranged along a direction of extension of said first electrode and which provide capacitive coupling between said plurality of second electrodes.

* * * * *